(12) United States Patent
Hetherington et al.

(10) Patent No.: US 7,609,060 B2
(45) Date of Patent: Oct. 27, 2009

(54) NON ITERATIVE SHIMMING IN MAGNETIC RESONANCE IMAGING IN THE PRESENCE OF HIGH LIPID LEVELS

(75) Inventors: Hoby P. Hetherington, Woodbridge, CT (US); Jullie W. Pan, Woodbridge, CT (US)

(73) Assignee: Albert Einstein College of Medicine of Yeshiva University, Bronx, NY (US)

(*) Notice: Subject to any disclaimer, the term of this patent is extended or adjusted under 35 U.S.C. 154(b) by 0 days.

(21) Appl. No.: 12/080,510

(22) Filed: Apr. 3, 2008

(65) Prior Publication Data

US 2008/0258725 A1    Oct. 23, 2008

Related U.S. Application Data

(60) Provisional application No. 60/925,626, filed on Apr. 20, 2007.

(51) Int. Cl.
*G01V 3/00* (2006.01)
(52) U.S. Cl. ....................................................... 324/307
(58) Field of Classification Search ......... 324/300–322; 600/410–435
See application file for complete search history.

(56) References Cited

U.S. PATENT DOCUMENTS 6,841,997 B2 *  1/2005  Feiweier ...................... 324/307

7,154,269 B1 * 12/2006  Haacke et al. ............... 324/309
7,196,518 B2 *  3/2007  Yatsui et al. ................. 324/307

FOREIGN PATENT DOCUMENTS

EP        1310211 A1 *  5/2003

OTHER PUBLICATIONS

Gruetter R et al., entitled "Fast, Noniterative Shimming of Spatially Localized Signals. In Vivo Analysis of the Magnetic Field along Axes," Journal of Magnetic Resonance, 96, 323-334 (1992).
Hetherington H P et al., entitled "Field Map Based Automated Shimming for Organs Outside of the Human Brain," Proc. Intl. Soc. Mag. Reson. Med. 14 (2006), p. 63.
Hetherington H P et al., entitled "Robust Fully Automated Shimming of the Human Brain for High-Field 1H Spectroscopic Imaging," Magnetic Resonance in Medicine 56:26-33 (2006).

(Continued)

*Primary Examiner*—Brij B Shrivastav
*Assistant Examiner*—Dixomara Vargas
(74) *Attorney, Agent, or Firm*—Amster, Rothstein & Ebenstein LLP (57) ABSTRACT

For the brain, a variety of automated non-iterative shimming methods using phase evolution derived $B_0$ maps have been reported. These methods assume that there is only a single chemical species contributing to the image. Although true in the brain, lipid contributions from skin, bone marrow and structural fat, may approach or exceed the concentration of water in other organs. In these instances, standard $B_0$ mapping methods cannot be used due to contributions arising from the lipids. To overcome these limitations the present invention discloses a multi-point $B_0$ mapping method combined with Dixon imaging to provide fully automated shimming of the human calf.

17 Claims, 6 Drawing Sheets

OTHER PUBLICATIONS

Hetherington H P et al., entitled "An Automated Shim Mapping Method for Spectroscopic Imaging of the Human Hippocampus," Proc. Intl. Soc. Mag. Reson. Med. 13 (2005), p. 730.

Isaac G et al., entitled "Fully Automated Shimming for High Lipid Regions using Phased Arrays at 3T," Proc. Intl. Soc. Mag. Reson. Med. 16 (2008), p. 3241.

Miyasaka N et al., entitled "Fully Automated Shim Mapping Method for Spectroscopic Imaging of the Mouse Brain at 9.4T," Magnetic Resonance in Medicine 55:198-202 (2006).

Miyasaka N et al., entitled "A Shim Mapping Method for Spectroscopic Imaging of the Mouse Brain at 9.4T," Proc. Intl. Soc. Mag. Reson. Med. 13 (2005), p. 550.

Shen J et al., entitled "Linear Projection Method for Automatic Slice Shimming," Magnetic Resonance in Medicine 42:1082-1088 (1999).

Schneider E et al., entitled "Rapid in Vivo Proton Shimming", Magnetic Resonance in Medicine 18, 335-347 (1991).

* cited by examiner

NON ITERATIVE SHIMMING IN MAGNETIC RESONANCE IMAGING IN THE PRESENCE OF HIGH LIPID LEVELS

CROSS-REFERENCE TO RELATED APPLICATION

This application claims the benefit of U.S. Provisional Patent Application Ser. No. 60/925,626, filed Apr. 20, 2007, the contents of which are incorporated by reference into the subject application.

STATEMENT OF GOVERNMENT SUPPORT

The invention disclosed herein was made with U.S. Government support under National Institutes of Health (NIH) grant numbers EB000473 and EB001748. Accordingly, the U.S. Government has certain rights in this invention.

FIELD OF THE INVENTION

The present invention relates to magnetic resonance (MR) imaging and more particularly to a method for mapping and reducing magnetic field variations when an object is in an imaging magnetic field.

BACKGROUND OF THE INVENTION

Throughout this application various publications are referred to in parenthesis. Full citations for these references may be found at the end of the specification immediately preceding the claims. The disclosures of these publications are hereby incorporated by reference in their entireties into the subject application to more fully describe the art to which the subject application pertains.

Magnetic resonance imaging (MRI) is widely used in clinical diagnosis. In an MRI imaging sequence, a uniform magnetic field $B_0$ is applied to an imaged object along the z-axis of a spatial Cartesian reference frame. The effect of the magnetic field $B_0$ is to align some of the object's nuclear spins along the z-axis. In such a field, the nuclei resonate at their Larmor frequencies according to the following equation:

$$\omega = \gamma B_0$$

where $\omega$ is the Larmor frequency, and $\gamma$ is the gyromagnetic ratio. The gyromagnetic ratio is constant and a property of the particular nucleus. The protons of water, for example, because of their relative abundance in biological tissue are of interest in MRI imaging. The value of the gyromagnetic ratio $\gamma$ for the protons of water is about 4.26 kHz/Gauss. Therefore, in a 1.5 Tesla polarizing magnetic field $B_0$, the resonance or Larmor frequency of the protons is approximately 63.9 MHz.

Materials other than water, principally lipids, may also be found in biological tissue. The protons of lipids have a slightly different gyromagnetic ratio; the lipid frequency is approximately 220 Hz lower than that of water protons in the same 1.5 Tesla polarizing magnetic field $B_0$. The difference between the Larmor frequencies of such different substances, under an identical magnetic polarizing field is termed "chemical shift" and is designated by the term $\Delta v$. Accordingly, $\Delta v$ increases as the field strength $B_0$ increases.

The accuracy of an MRI image is highly dependent upon the uniformity of the polarizing magnetic field $B_0$. Ordinary variations in the magnetic field may be due to structural asymmetries in the MRI coil itself, and tend to be relatively static and predictable, and therefore easier to compensate. For example, it is well known in the art that the homogeneity of the polarizing magnetic field $B_0$ may be improved by shim coils which are oriented to selectively produce a magnetic field that interacts with $B_0$ in a manner that offsets known inhomogeneity in the field. However, the object being imaged also has a significant effect on magnetic field homogeneity which can be more difficult to detect and correct. Furthermore, the ability of shim coils to correct even accurately and precisely known inhomogeneity is limited by the number and geometry of the shim coils available.

For MRI imaging of the brain, a variety of automated non-iterative shimming methods using either columnar projections (1-5) or images of phase evolution to generate $B_0$ maps have been reported (6-11). Intrinsic to most of these methods is the assumption that there is only a single chemical species contributing to the image. Under these conditions the frequency offset (i.e., $B_0$ inhomogeneity) can be determined from the phase difference between two acquisitions acquired with different evolution times. However in organs and tissues outside of the brain the lipid resonances can dominate the water resonance. For example, in skeletal muscle, lipid contributions from skin, bone marrow and structural fat exceed the water resonance. When significant lipid contributions are present, the measured phase reflects a vector sum of water and lipid resonances, with the phase of the lipid resonances being modulated by both the intrinsic field inhomogeneity and the chemical shift difference between the water and lipid resonances. In these instances, standard phase difference based $B_0$ mapping methods using arbitrary evolution times cannot be used due to the additional phase/frequency contribution arising from the lipid resonances (9).

To address this problem for the whole head, including both brain and scalp, Schneider and Glover (9) reported that the lipid artifact from the scalp in brain $B_0$ maps could be reduced if the evolution time $\Delta t$ was chosen such that the phase precession due to the chemical shift of the methylene lipid resonance was exactly $2\pi$ relative to that of water. Thus, at this evolution time, resolution of the fat and water resonances and correction for the additional phase precession of the fat resonance is not required (12). However, the use of a single relatively short time interval limits the accuracy of the $B_0$ maps obtained (2). Similarly, the maximum frequency span measurable without aliasing is also limited. This becomes especially acute at higher field strengths as $\Delta v$ increases ($1/\Delta v < 2$ ms at 4 T).

Although integral multiples of $1/\Delta v$ can be used to increase the accuracy, this increases the probability that aliasing will occur and the severity of any aliasing that does occur. Although sophisticated mathematical algorithms for phase unwrapping in two (13) and three dimensions (14) have been described, they are based on assumptions regarding the rate of change in $B_0$ and $dB_0/dr$, which may not hold in regions of high local susceptibility. These inaccuracies then result in errors in the calculated shims, necessitating additional iterations or in some cases incorrect solutions. Thus, spectroscopic imaging studies outside the brain, which sample large regions of interest (ROIs), continue to be limited by the inability to simultaneously shim large regions automatically (15).

In the brain where lipids are not an issue, the limitation in accuracy and aliasing have been overcome by using a multi-evolution time acquisition with a novel acquisition based unwrapping scheme that makes no assumptions regarding $dB_0/dr$, providing both high accuracy and high bandwidth (large $\Delta B_0$ range) (10, 11). However, to be applicable outside of the brain, the effects of additional phase precession of the lipid signal due to chemical shift evolution must be deconvoluted from phase precession in both resonances due to $B_0$ inhomogeneity.

As originally described by Dixon (16), water and fat can be resolved from each other in images using the differential phase modulation of the lipid resonance due to chemical shift difference with water when two images are added/subtracted and an additional evolution time ($\Delta t = \frac{1}{2}\Delta v$) is used in the second image. As noted by Glover and colleagues (17), the performance of this approach degrades in the presence of $B_0$ inhomogeneity, since phase modulation due to chemical shift differences cannot be resolved from inhomogeneity in the main field. To overcome this effect, various three point measurement methods have been described (18, 19). These measurements allow the content of fat and water to be identified independent of the $B_0$ inhomogeneity present, under the conditions that the dominant species could be identified.

Although Dixon imaging is effective at distinguishing between water and lipid resonances, Dixon images do not themselves provide an accurate map of $B_0$ inhomogeneity. Accordingly, a need exists for a method for generating an accurate $B_0$ map in the presence of an object having two materials having different Larmor frequencies. In particular, a need exists for a non-iterative method for mapping $B_0$ inhomogeneity in the presence of high lipid levels relative to water, for example as in the human leg.

SUMMARY OF THE INVENTION

If the relative lipid/water ratio is known, the contribution solely due to $B_0$ inhomogeneity can be calculated for arbitrary $B_0$ evolution times, including time intervals when they are exactly opposite in phase. Thus once the relative contributions of the water and lipid resonances have been determined, the phase contribution of each can be determined and the effect of the local $B_0$ field can be calculated. Accordingly, an object of the present invention is to extend the availability of methods used in MR imaging in the brain to other organs where lipids are in high content and can exceed the water contribution (e.g. bone marrow from the human leg). The present invention describes a shim method for shimming an entire slice of the leg (including bone marrow and subcutaneous fat) and acquiring a whole slice spectroscopic image of the human leg.

The present invention provides a method for mapping the inhomogeneity of a magnetic field ($B_0$) within an object in an MRI system where the object contains a first and a second material having a first and second Larmor frequency, such as water and a lipid. The first step in an embodiment of the method of the present invention is the acquisition of a plurality of images of an object in an MRI system. Preferably, n>3 images at different evolution times are acquired.

In the next step, the phase contributions due to the second material are calculated. For example, at least three of the plurality of images may be used in the application of the well-known Dixon technique to calculate the contribution in the plurality of images due to the second material. These three images have evolution times that are preferably determined as a function of the chemical shift between the first and second material. More preferably, the predetermined evolution time interval, $\Delta t$, is defined by the equation $\Delta t = \frac{1}{2}\Delta v$ where $\Delta v$ is the chemical shift between the first and second material in Hz.

In the next step, the additional phase contribution from the second material due to its chemical shift difference from water is removed from the plurality of images. In a preferred embodiment, using the Dixon results, the contribution to the images due to the frequency difference of the second material can be removed from the images, leaving a phase map reflective of only the inhomogeneity of the object. For example, in an image of a human leg, the additional phase contributions due to the frequency difference of the lipid contributions relative to that of water, once revealed, such as through the application of the Dixon technique, can be removed from the image, leaving a phase map reflective of only the inhomogeneity of the object.

Having isolated a phase map for the inhomogeneity of the magnet corresponding to each of the plurality of acquired images, the next step in the method of the present invention is to correct for or "unwrap" any aliasing present in the phase maps of images having relatively longer evolution times by reference to phase maps of images having relatively shorter evolution times (as measured from a reference image). In a preferred embodiment, the step of unwrapping aliasing present in phase maps having relatively longer evolution times (or longer evolution delay) comprises using the phase map of a base image to predict and correct for aliasing in a target image having a longer evolution time (or longer evolution delay) than that of the base image.

More specifically, in a preferred embodiment, the prediction of aliasing in a target image calls for calculating a frequency map based on the respective evolution delays of the base image, $\Delta t_{base}$, and the target image, $\Delta t_{target}$, and identifying regions in the target image, based on said frequency map, wherein i) wrapping is not predicted to occur, ii) wrapping is predicted to occur, and iii) wrapping in the target image cannot be predicted.

More specifically, in a preferred embodiment, the correction of aliasing in a target image calls for measuring the phase difference between the base image and the target image as a function of their respective evolution delays $\Delta t_{base}$, $\Delta t_{target}$, and i) calculating the frequency based on the phase difference, in regions of the target image where wrapping is not predicted to occur, ii) correcting the phase and calculating the frequency based on the corrected phase in regions of the target image where wrapping is predicted to occur, and iii) selectively retaining the current frequency value observed in the base image in regions of the target image where wrapping cannot be predicted and the calculated frequencies in the target and reference image are significantly different.

To maximize efficiency in generating the $B_0$ map, the evolution delay of the target image, $\Delta t_{target}$, is twice that of the base image $\Delta t_{base}$.

The results of the unwrapping procedure are used to generate a single map of magnetic field, $B_0$, inhomogeneity. The information provided by this map can be processed and uploaded to the shimming subsystem of the MRI to compensate for variations in the magnetic field. To the extent that the resolution of the $B_0$, inhomogeneity map exceeds the capability of the shimming subsystem to compensate for the variations, the $B_0$, inhomogeneity map produced by the method of the present invention may be retained and used for post-acquisition processing of MRI images, for example, to increase their accuracy.

The $B_0$, inhomogeneity map obtained by the application of the present invention will also be recognized, due to its increased precision and accuracy, as useful in any MRI application where a high quality $B_0$ field map would be of use—for example in functional MRI (echoplanar imaging) applications.

According to a preferred embodiment of the invention, the plurality of images acquired by the MRI belong to one or more of two image sets, a first image set preferably associated with the at least three images used to perform the Dixon technique, and a second image set containing the at least three images used to carry out the unwrapping procedure. These image sets may intersect (in one embodiment, the first image set may be a subset of the second) or they may be distinct. The at least three images in the second image set are measured by reference to an image preferably having a relatively short evolution time called a "reference image". The images in the second image set have ascending evolution delays $\Delta t_1$-$\Delta t_n$, where n is the total number of images in the set and the evolution delay of the reference image $\Delta t_0$=0. Accordingly, the reference image may be arbitrarily selected from any of the plurality of images acquired by the MRI, provided that there are at least a total of three images in the set, all of which must have a longer evolution time than the reference image.

To increase the accuracy the images in the first and second image sets may be selected to minimize differential T2 relaxation between the first and second material across the range of images acquired by the MRI system. Moreover, selecting the first image set from images in the second image set may reduce the total number of images required to perform the method of the present invention.

The foregoing and other objects and advantages of the method of the present invention will appear from the following detailed description. In the detailed description, reference is made to the accompanying drawings which form a part hereof, and in which there is shown by way of illustration a preferred embodiment of the invention. Such embodiment does not represent the full scope of the invention, however, and reference is made therefore to the claims herein for interpreting the scope of the invention.

DETAILED DESCRIPTION OF THE INVENTION

Figure 6:
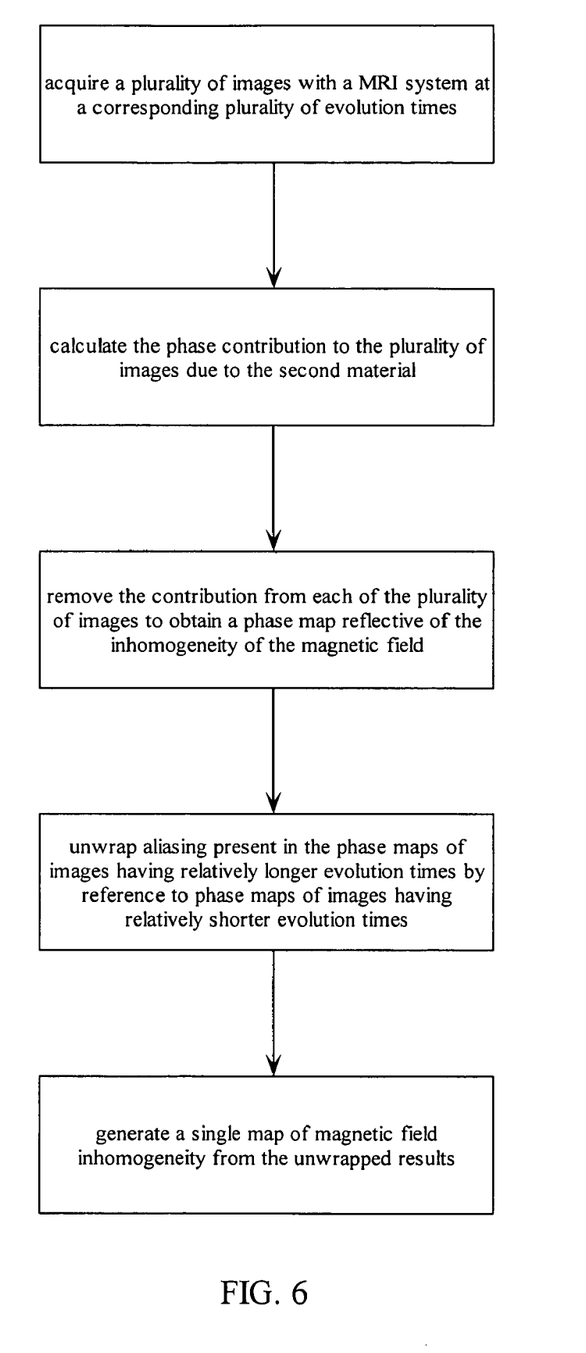
FIG. 6. Flow chart of method for mapping the inhomogeneity of a magnetic field within an object in an MRI system, where the object contains a first material and a second material.

The invention provides a method for mapping the inhomogeneity of a magnetic field within an object in an MRI system, where the object contains a first and a second material, comprising the steps of:

a) acquiring a plurality of images with the MRI system at a corresponding plurality of evolution times, b) calculating the phase contribution to the plurality of images due to the second material, c) removing said contribution from each of the plurality of images to obtain a phase map reflective of the inhomogeneity of the magnetic field, d) unwrapping aliasing present in the phase maps of images having relatively longer evolution times by reference to phase maps of images having relatively shorter evolution times, and e) generating a single map of magnetic field inhomogeneity from the unwrapped results.

Preferably, the first material is water and the second material has a Larmor frequency different from that of water. Preferably, the second material is a lipid such as human fat tissue.

Preferably, the plurality of images comprises a first image set of at least three images separated by a predetermined evolution time interval, $\Delta t$, and a second image set of $n \geq 3$ images each having evolution times respectively corresponding to ascending evolution delays $\Delta t_1$-$\Delta t_n$, said evolution delays measured relative to a reference image corresponding to evolution delay $\Delta t_0$=0.

Preferably, the step of unwrapping aliasing is performed on images in the second image set.

Preferably, the first image set and said second image set intersect.

Preferably, the predetermined evolution time interval $\Delta t$ is a function of the chemical shift between said first and second material.

Preferably, the step of calculating the phase contribution to the plurality of images due to the second material further comprises calculating a Dixon image from the images in said first image set.

Preferably, the predetermined evolution time interval, $\Delta t$, is defined by the equation $\Delta t = \frac{1}{2} \Delta v$ where $\Delta v$ is the chemical shift between said first and second material in Herz.

Preferably, the step of unwrapping aliasing further comprises using the phase map of a base image to predict and correct for aliasing in a target image where the target image has a larger evolution delay than that of the base image.

Preferably, predicting of aliasing in the target image comprises the steps of: calculating a frequency map based on the respective evolution delays of the base image and the target image, and identifying regions in the target image, based on the frequency map, wherein wrapping is not predicted to occur, wrapping is predicted to occur, and wrapping cannot be predicted.

Preferably, correcting of aliasing in the target image comprises the steps of: measuring the phase difference between the base image and the target image as a function of their respective evolution delays and calculating the frequency based on the phase difference, in regions of the target image where wrapping is not predicted to occur, and correcting the phase and calculating the frequency based on the corrected phase in regions of the target image where wrapping is predicted to occur. Preferably, the step of correcting of aliasing further comprises retaining the current frequency value observed in the base image in regions of the target image where wrapping cannot be predicted to occur. Preferably, the current frequency value is selectively retained when the calculated frequencies in the base and target image are significantly different.

Preferably, the evolution delay of the target image is longer than the evolution delay of the base image by a factor of two.

Preferably, the first image set and the second image set are selected to minimize differential T2 relaxation between the first material and the second material. Preferably, the first image set and the second image set intersect.

Preferably, the second material comprises a plurality of compounds having different Larmor frequencies. Preferably, the chemical shift is calculated based on an estimated Larmor frequency model corresponding to the composition of the second material.

Preferably, the method further comprises using information from the map to compensate for inhomogeneity in the magnetic field within the MRI system. Preferably, the information is uploaded to shimming coils to compensate for said inhomogeneity in said magnetic field.

This invention will be better understood from the Experimental Details, which follow. However, one skilled in the art will readily appreciate that the specific methods and results discussed are merely illustrative of the invention as described more fully in the claims that follow thereafter.

Experimental Details

Theory

Based on the distribution of a set of n distinct resonances in the spectrum (omitting the effects of J-coupling) the measured signal is given by $$A_{msd} exp(-i\Phi_{msd}) = \Sigma A_n exp(-i\Phi_n) \quad (Eq. 1)$$

where $A_{msd}$ and $\Phi_{msd}$ are the measured values for amplitude and phase from the pixel of interest. In this case, n refers to the nth resonance present and $\Phi_n$ is the phase of that species due to phase evolution during the delay. Neglecting all but the water resonance and the dominant lipid resonance (the methylene), the measured signal in a given voxel for any delay can be written as $$A_{msd} exp(-i\Phi_{msd}) = A_w exp(-i\Phi_w) + A_f exp(-i(\Phi_{wf} + \Phi_w)) \quad (Eq. 2)$$

where $A_w$ and $A_f$ are the amplitudes of the water and fat signals, $\Phi_w$ is the phase due to the $B_0$ field and $\Phi_{wf}$ is the phase due to the chemical shift difference between fat and water.

Assuming that there is negligible differential T2 relaxation between water and fat, i.e. $A_w/A_f$ is constant over the range of sampled $B_0$ evolution times, $\Delta t$, the signal in any pixel in any map is given by Eq. (2). Using $A_w$ and $A_f$ as determined from the three point Dixon images, a phase map due to $B_0$ inhomogeneity, $\Phi_w$, can be determined for any arbitrary echo time. The maps of $\Phi_w$ then represent just the effect of $B_0$ inhomogeneity, identical to that seen if only a single species, water, were present. When suitable routines correcting for aliasing are used (10, 11), $B_0$ maps can then be calculated using multiple evolution time delays.

Methods

Figure 1:
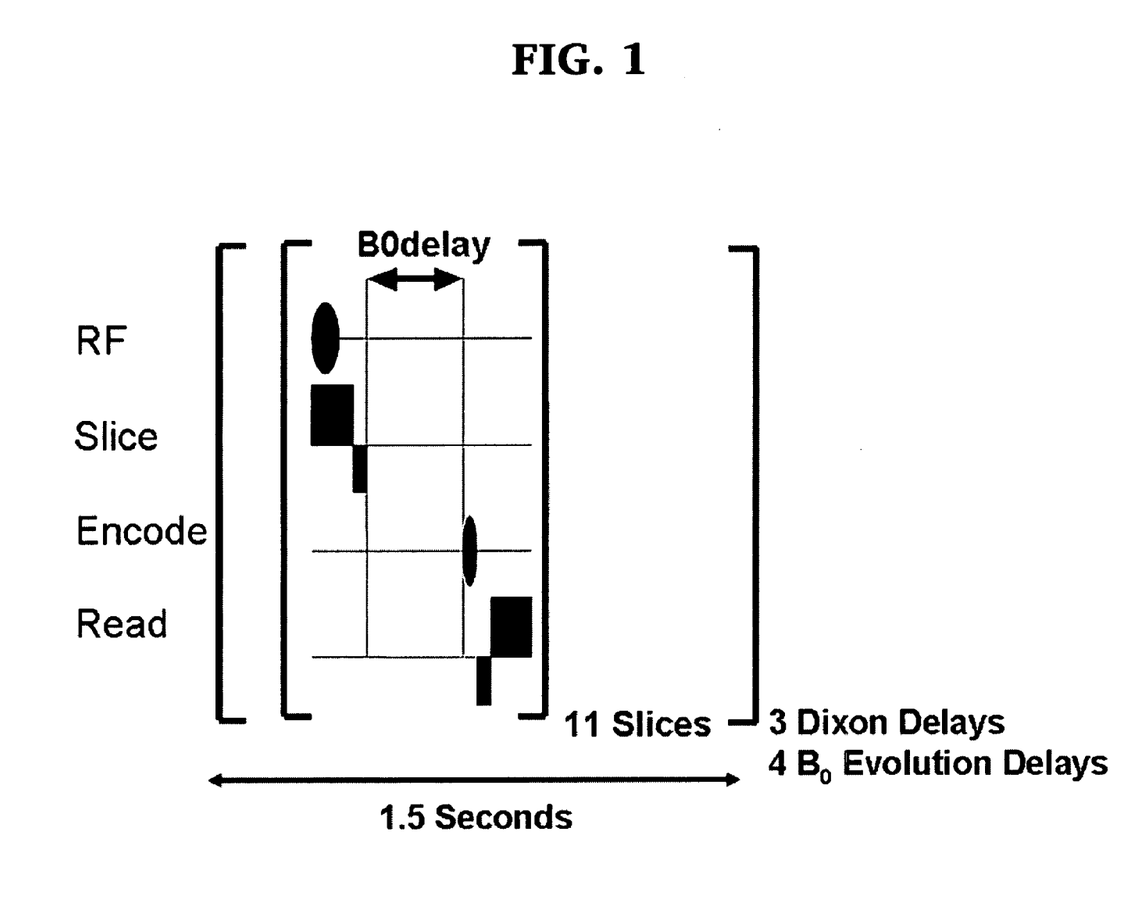
FIG. 1 is a diagram of a pulse sequence. A gradient echo acquisition is looped over all slices (11) and then over all evolution delays (7 in total) during each 1.5S TR. The sequence is then repeated for each phase encoding step to obtain the $B_0$ mapping data.

All data were acquired on a Varian INOVA 4 T whole body MR system using a TEM coil. Anatomical images were acquired with a gradient echo sequence using 128×128 resolution over a 192×192 FOV with TE/TR of 7/500 ms. $B_0$ maps were obtained using a multi-slice (11 slices, 2 mm thick/2 mm gap) gradient echo imaging sequence (64×64 resolution, FOV 192×192 mm) with 7 $B_0$ evolution times. The first three evolution times were selected for the first image set and used to reconstruct Dixon images where the evolution delays are determined by the equation $\Delta t = \pm \frac{1}{2} \Delta v$(fat-water), in this case $\Delta t = \pm 0.9$. The four additional evolution times were used to calculate $B_0$ maps wherein the additional evolution delays of 0.9, 1.8, 3.6 and 7.2 ms each have a delay $\Delta t_n$ doubling that of the next shortest delay ($\Delta t_n = 2\Delta t_{n-1}$) where the second evolution delay, $\Delta t = 0$, was selected as the reference for purposes of defining a second image set. The total echo times including the three evolution delays used for Dixon imaging, the additional evolution delays and the minimum delay required for slice selection, phase encoding and readout gradients, ranged from 6 to 14 ms. All evolution times for both image sets (both $B_0$ and Dixon) were acquired with each phase encoding step (77 slices per TR) resulting in a total measurement time of 96 seconds for the leg (64 encodes×1.5 s) (FIG. 1).

The first three $B_0$ delays (−0.9, 0, +0.9 ms) were used to calculate a three point Dixon image and determine $A_w$ and $A_f$. Assuming that there is negligible differential T2 relaxation between water and fat, i.e. $A_w/A_f$ is constant over the range of sampled $\Delta t$ times, the signal in any pixel in any map is given by Eq. (2). Using this assumption, a phase map of $\Phi_w$ for each pixel for each evolution time was calculated.

Using the phase maps, $\Phi_w$, a single $B_0$ map was then calculated by "unwrapping" the aliasing present in the longer $\Delta t$ images. "Unwrapping" was achieved analytically by using the phase map of each base image evolution delay (e.g., $\Delta t_{base} = 0.9$ ms) to predict and correct for phase wrapping in the target image with the next longest evolution time (e.g., $\Delta t_{target} = 1.8$ ms). For this study, starting with the reference image $\Delta t_0 = 0$ ms and $\Delta t_1 = 0.9$ ms images, the phase difference $\Phi_w$ was determined and a frequency map (±550 Hz range for $\Delta t = 0.9$ ms) was calculated. From this map, three regions within the next longest evolution image ($\Delta t_2 = 1.8$ ms in this case) were identified: 1) regions which will not wrap (less than of 90% of the wrap value, e.g. within ±248 Hz of the carrier), 2) regions which will wrap (more than 10% beyond the wrap points, e.g. more than ±303 Hz), and 3) those which may wrap (within ±10% of the wrap point). The inclusion of a third group, regions near the wrap points, is to account for the possibility of an error in assignment due to signal-to-noise ratio (SNR) limitations and their effect on the measured phase. In those regions where the phase will not wrap, the phase difference measured between the base image $\Delta t_1 = 0.9$ and target image ($\Delta t_2 = 1.8$ ms) is then determined and the frequency calculated. In those regions where the phase will definitely wrap the phase is corrected and the frequency calculated. For those regions where the phase may or may not be wrapped, the calculated frequency in the current image (in this case $\Delta t_2 = 1.8$ ms) is compared to the image with the next shortest time ($\Delta t_1 = 0.9$ ms image), and if the measured frequency differs by more than 20%, it is assumed that the phase correction was incorrectly applied, and the value from the next shortest evolution time image ($\Delta t_1 = 0.9$ ms image in this case) is used. The process is then repeated for each consecutive pair of images until the final $\Delta t_4 = 7.2$ ms image has been calculated. Since a value that wraps in a lower image will always wrap in a higher image, this allows the measured $B_0$ map to have the frequency span of the shortest evolution time ($\Delta t_1 = 0.9$ ms, ±550 Hz) and the resolution of the longest evolution time $\Delta t_4 = 7.2$ ms (~0.4 Hz/degree). Notably, for the two shortest images in this set $\Delta t = 0.9$, the fat resonance and the water resonance are 180° out of phase.

The $B_0$ map is then fit as a sum of spherical harmonics ($1^{st}$-$3^{rd}$ order). These values are then scaled, corrected for response impurities (i.e. cross correlation terms between high order and lower order shims) and uploaded to the shim amplifiers.

[1]H spectroscopic imaging data of the human leg was acquired using a slice selective adiabatic refocusing pulses (planar selection) and a semi-selective excitation pulse for water suppression. In plane localization was obtained using two dimensions of phase encoding (32×32) with a TR of 1 s, resulting in an acquisition time of 17 minutes. A total echo time of 24 ms was used. The data was reconstructed with a cosine filter in the spatial domain and 6 Hz of line broadening in the frequency domain.

Results and Discussion

Figure 2:
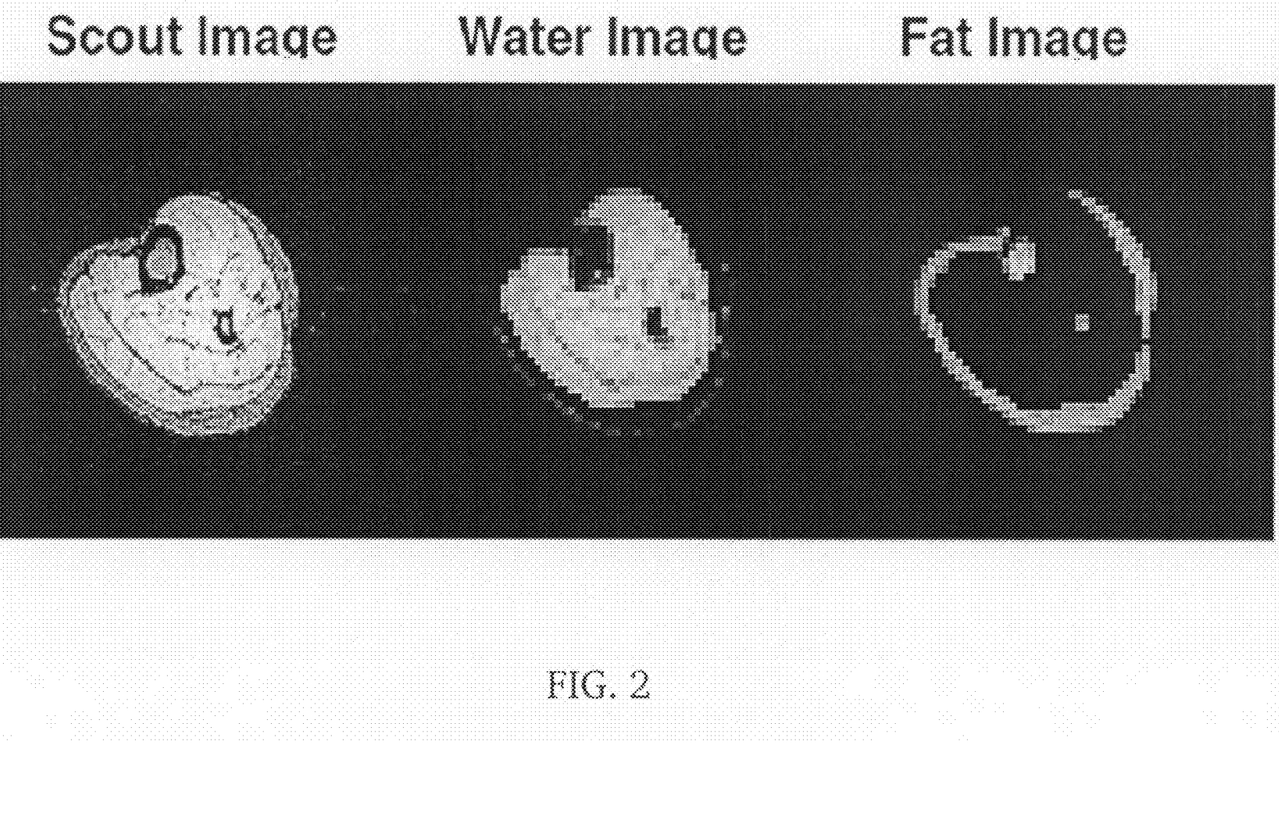
FIG. 2 is an anatomical image (gradient echo) from a human calf, and the low resolution (64×64) water and fat images acquired from a three-point Dixon map.

In the calf, lipid signals from the bone marrow and subcutaneous fat exceed that of the water signal. To measure the relative contributions of water and lipid components from these regions we calculated a three point Dixon image using the first three evolution periods of the gradient echo acquisition. Displayed in FIG. 2 are the scout image of the leg and the lower resolution (64×64) individual fat and water images from the $B_0$ mapping acquisition, and an image generated by subtracting the water and lipid images. Note that the lipid signal exceeds the water signal (red pixels) in amplitude in the bone marrow and fat layer surrounding the leg, whereas the water exceeds that of the lipids (blue pixels) in the muscle tissue.

Figure 3:
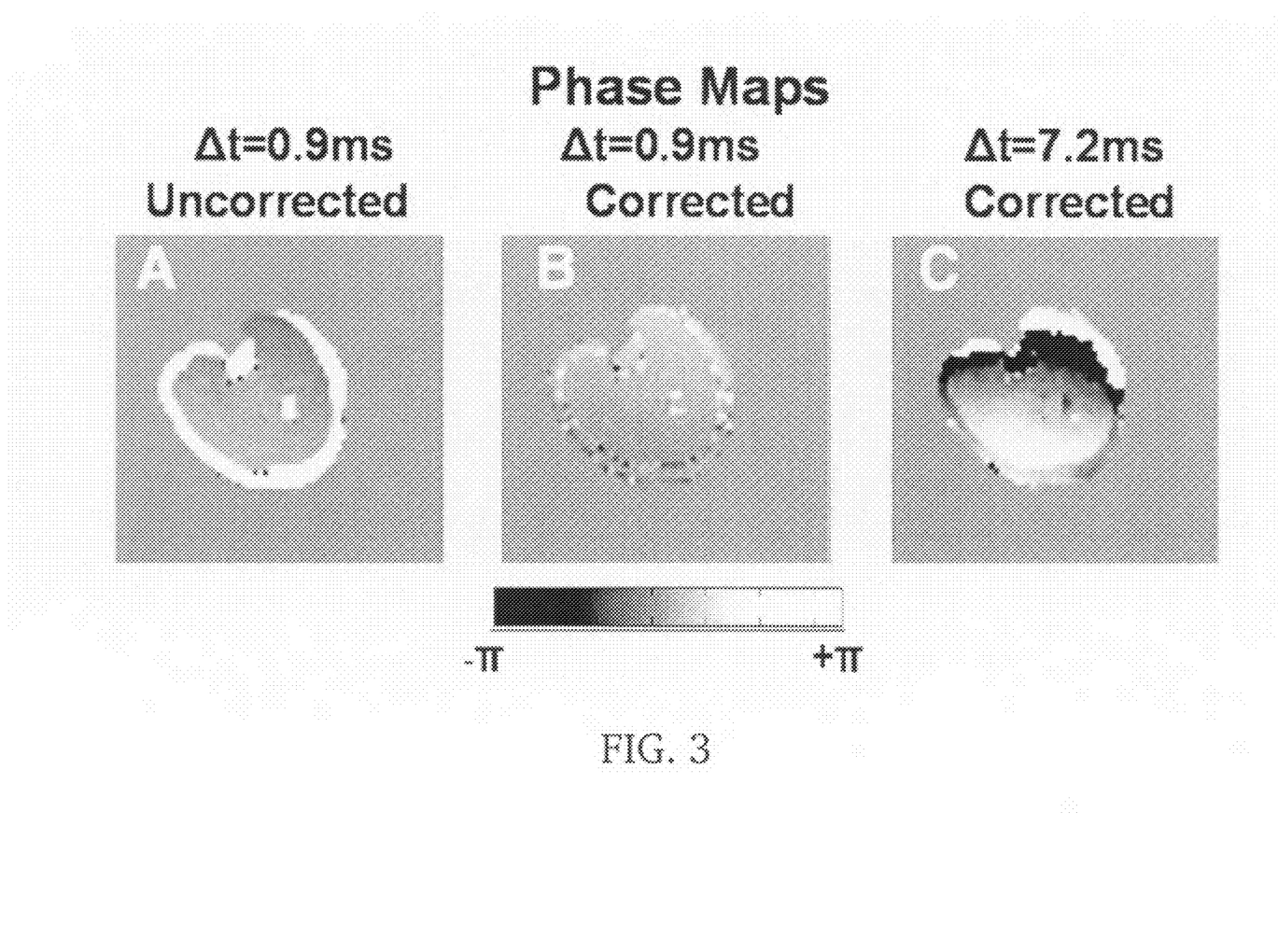
FIGS. 3A-C are phase maps acquired using: A) $\Delta t$=0, 0.9 ms without any correction for the presence of lipids; B) $\Delta t$=0, 0.9 ms with phase correction for lipids and C) $\Delta t$=0, 7.2 ms without corrections for aliasing.

To demonstrate the effect that this has on the calculated $B_0$ map we have calculated $B_0$ maps using $\Delta t=0$ and $\Delta t=0.9$ ms, assuming only a single species (water) FIG. 3A. As expected without any correction for multiple components there are strong discontinuities in the calculated field in regions where the lipids dominate the water resonance. In fact the lipid resonance aliases, and appears to come from a positive frequency. Thus without correcting for the multiple components would result in significant errors in the shortest $B_0$ evolution images (i.e. $\Delta t=0.9$ ms in this case). However as seen in FIG. 3B, when the correction for lipid and water content is applied, this effect is eliminated and the $B_0$ map can be correctly generated. FIG. 3C displays a map calculated using $\Delta t=0$ and $\Delta t=7.2$ ms, correcting for the presence of a lipid signal, but without the described unwrapping or aliasing routine. As can be seen, the frequency span exceeds the measurement bandwidth, and there is substantial aliasing (red pixels immediately adjacent to blue pixels) in the $\Delta t=7.2$ ms image.

Figure 4:
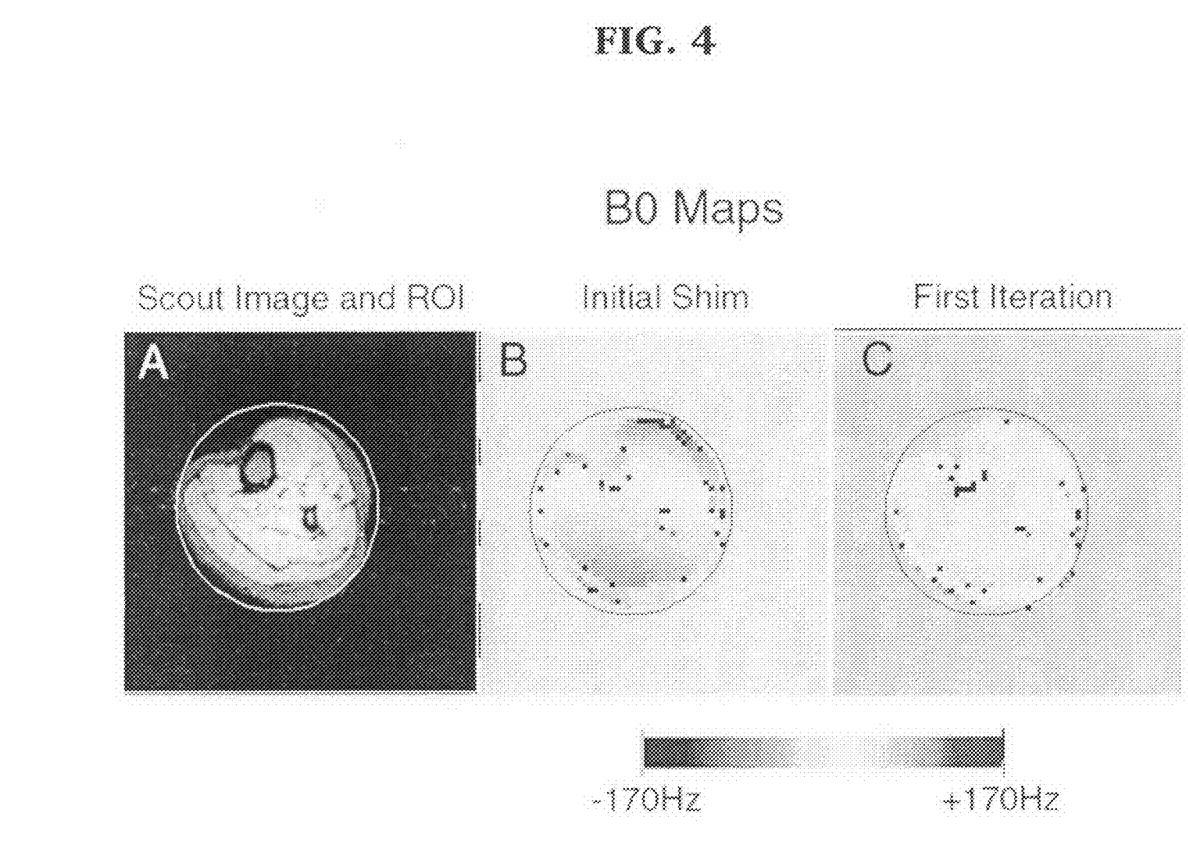
FIGS. 4A-C are A) scout image showing the ROI in white and $B_0$ maps acquired: B) $B_0$ before shimming and C) after one iteration of the shimming methods. The SD of the $B_0$ inhomogeneity over the ROI was 31.05 and 8.87 Hz in images 4B and 4C respectively.

To test the ability of the shim routine, we set all first, second and third order corrections to zero before acquiring the maps. Displayed in FIG. 4 are the calculated $B_0$ maps prior to shimming and after a single iteration using the method described combining the three point Dixon maps with multiple evolution times. The ROI utilized for shimming is delineated by the white circle, and includes the entire leg within the slice. To better visualize the range, the maps have been shifted such that the mean of all pixels within the ROI is set to 0 (the background color changes slightly but the scale remains unchanged). For the spectroscopic imaging study, the three central images were included in the calculation so as to cover the 10 mm slice thickness acquired by the CSI. Despite the inclusion of bone marrow and subcutaneous fat in the analyzed ROI, the overall homogeneity is dramatically improved in a single pass. Prior to shimming the SD of the $B_0$ values over the entire leg within the slice was 31.05 Hz. After fitting the residual field using $1^{st}$-$3^{rd}$ order spherical harmonics, the predicted residual field after correction was 9.45 Hz. After applying the correction, a second map was acquired and the SD of the $B_0$ inhomogeneity was 8.87 Hz, in agreement with the predicted value. A shift in frequency is seen at the interface of subcutaneous fat and bone marrow with muscle. Possible origins of this "discontinuity" and approaches to overcoming it are discussed later in the text.

Figure 5:
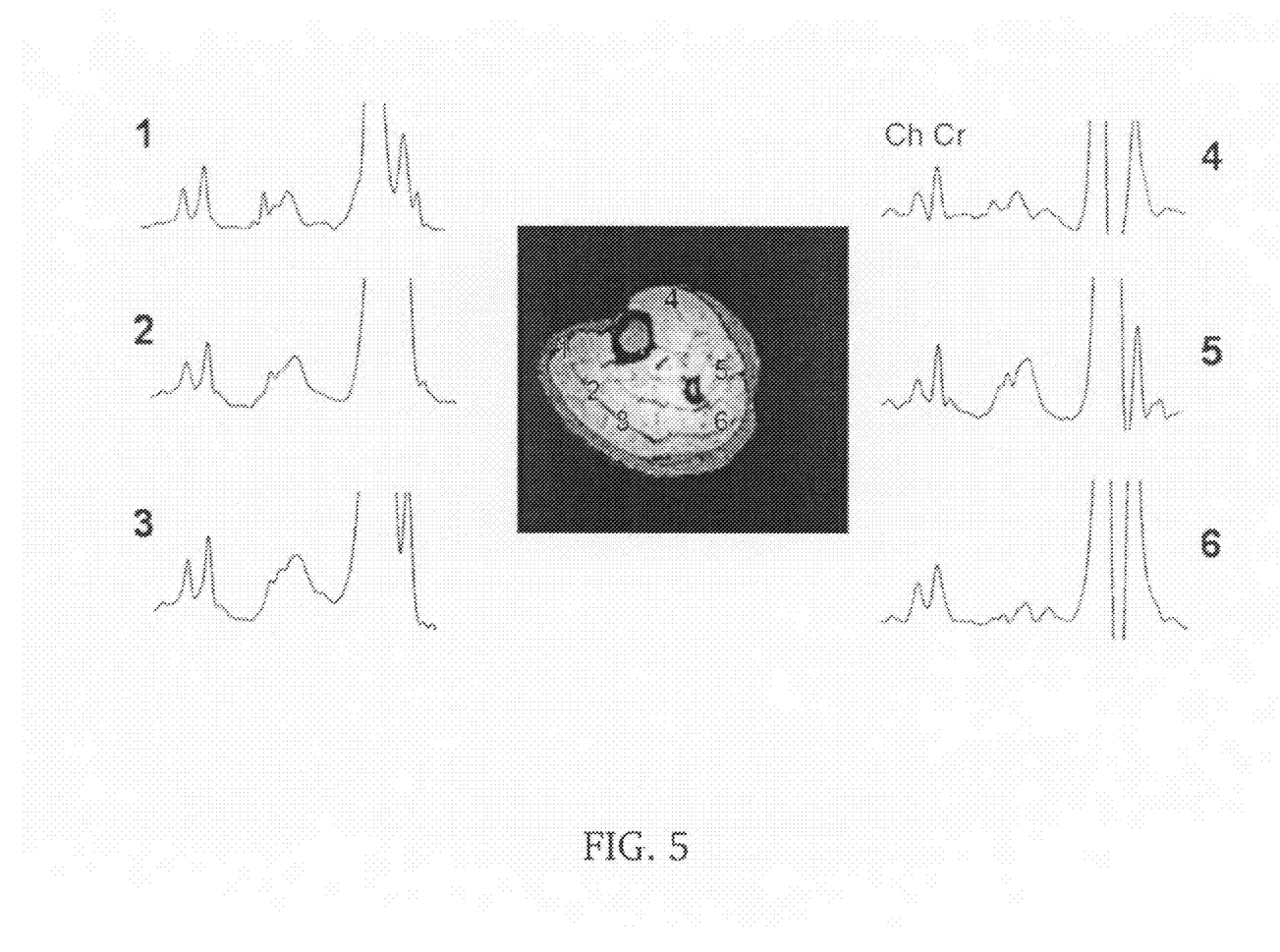
FIG. 5 are spectra displaying creatine (Cr) and choline (Ch) from various locations in the leg after shimming. The spectra have been truncated in the vertical direction (lipid resonance) so as to provide better visualization of the choline and creatine resonances.

Displayed in FIG. 5 are representative spectra from selected loci about the periphery of the leg. Again, excellent resolution (resolution of choline and creatine resonances to baseline or near baseline) is obtained throughout the entire slice despite the inclusion of all locations within the slice (including bone marrow and subcutaneous fat) in the shim calculation. In this case we have displayed the periphery so as to demonstrate the extent to which the entire leg can be imaged, and demonstrate the minimal effect of nearby lipid resonances (subcutaneous fat) have had on the homogeneity achieved.

To assess the extent to which the use of multiple evolution times enhances the accuracy of the measurement we also calculated $B_0$ maps and the predicted residual inhomogeneity after adjustment of the shims using $\Delta t=0.9$, $\Delta t=0.9$, 1.8 ms, $\Delta t=0.9$, 1.8, 3.6 ms and 0.9, 1.8, 3.6 and 7.2 ms. The values for the measured initial and predicted residual inhomogeneity are listed in Table 1. As can be seen with each additional evolution time, the initial measured homogeneity decreases as does the predicted residual inhomogeneity after adjustment. Thus as the accuracy of the maps improves, i.e. minimization of measurement noise which does not have a $1^{st}$-$3^{rd}$ order spatial distribution, the final result also improves. In this case the calculated measured SD decreased from 37.23 Hz to 31.05 Hz, a difference of 6.18 Hz, or ~16%. Although the predicted homogeneity after shimming improved from 15.15 to 9.45 Hz, a difference of 5.70 Hz, or ~38%. Thus as discussed by Gruetter (1) extension of the measurement time clearly maximizes the accuracy of the measurement.

The present invention discloses that fully automated shimming of the human leg using first through third order corrections can be obtained using the developed method. Despite the inclusion of lipid dominated regions such as bone marrow and subcutaneous fat, accurate $B_0$ maps are obtained. As expected, failure to include the shift due to the lipid resonance results in significant errors when contributions due to the lipid chemical shift are not included. Using the full method, a single iteration provided $B_0$ inhomogeneity sufficient to resolve the choline and creatine resonances to near baseline throughout the leg.

A careful inspection of the calculated maps reveals a shift in frequency is observed at the boundary between the lipid and water dominated regions. This may be due to a variety of factors including: 1) inaccuracies in the modeling the lipid contribution due to the inclusion of only a single lipid resonance; 2) a range in fat-lipid water shifts associated with the environment of the lipids and 3) differences in the T2 relaxation of water and lipids causing inaccuracies in the estimate of $A_w/A_f$. Errors due to the effects of multiple lipid resonances (i.e. methyl and unsaturated resonances) can be minimized by using a more complex model for the lipids. However variation in chain lengths and differences in the relative saturation of the lipid molecule will create regional and inter-individual differences. With regards to differences in chemical shift between different lipids, depending upon the orientation of muscle fibers a 0.2 ppm shift can be seen in the EMCL lipid resonance (20). At the longest evolution time, $\Delta T_4=7.2$ ms, the maximal shift, 0.2 ppm, would result in a phase shift of 88°. However this is for EMCL components in the muscle tissue, as opposed to IMCLs or those in the bone marrow or subcutaneous fat layer. In controls, EMCL values have been estimated to be ~20 mM/kg wet weight (20). Assuming a concentration of 61 mM of $^1H$ nuclei per mM of lipid, this equates to less than 2% of the water intensity. Based on the reported T2s of water (25 ms) and lipid in skeletal muscle at 4 T (60-100 ms, (21)), the differential relaxation in water and the methylene fat resonance due to an additional 7.2 ms is 21%. Thus for regions where lipids are more than 80% but less than 100% of the intensity of the water resonance, errors in assignment can occur. Despite these complexities, sufficient homogeneity to resolve the choline and creatine resonances to near baseline was possible throughout the majority of the leg.

The described study was carried out in the leg, where respiratory and cardiac motion is not significant. Thus no physiological gating was utilized. In abdominal organs such as the liver, the effects of respiratory motion will need to be limited. In this case, either a breath hold combined with a dramatically reduced TR (e.g. 0.5S TR, or 32S acquisition) (22) or respiratory gating will be required. Similarly for the heart cardiac gating will be required (12). For those sequences requiring gating, the number of slices and echo times will need to be modified such that all of the slices and the evolution times can be acquired while the ROI is in a relatively constant position. Use of echo-planar or spiral readout methods may significantly improve the data acquisition rate; however eddy current effects and image artifacts may have to be corrected for.

In this example, 7 evolution times were collected, so as to provide flexibility for the use of arbitrary evolution times. For regions with very poor initial homogeneity, this allows the initial evolution time to be set as short as possible to span the bandwidth of inhomogeneity present. However if the initial inhomogeneity present can be spanned by the evolution times used in generating the Dixon image, the number of evolution delays required can be reduced. Specifically, the three images used to calculate the Dixon image can be used to form the first three time evolution delays for the $B_0$ map. In this case the $\Delta t=0$ image for the $B_0$ map would use the shortest evolution time of the Dixon images. This reduces the number of evolution delays required to attain a specific accuracy (i.e. maximal evolution delay) by two. However as described, this requires that the homogeneity be sufficiently small to be captured by the first evolution time, and fixes the increments in $B_0$ mapping to integral multiples of the delay used for the Dixon images.

TABLE 1

| | Longest Evolution Time Used (ms) | | | | |
|---|---|---|---|---|---|
| | 0.9 | 1.8 | 3.6 | 7.2 | Adjusted |
| Measured SD (Hz) | 37.23 | 33.32 | 31.77 | 31.05 | 8.87 |
| Predicted SD (Hz) | 15.15 | 12.11 | 10.5 | 9.45 | 8.12 |

REFERENCES

1. Gruetter R, Boesch C, fast not iterative shimming of spatially localize signals. In vivo analysis of magnetic field long axis. Journal of magnetic resonance 1992, 96: 323-334.
2. Gruetter R, automatic localized in vivo adjustment of all first and second order shim coils. Magnetic resonance in medicine. 1993, 29: 804-811.
3. Shen, J, Rothman D. L., Hetherington H P, Pan J W, linear projection method for automatic slice shimming Magnetic resonance in medicine. 1999 42: 1082-1088.
4. Shen J, effect of degenerate spherical harmonics and a method for automatic shimming of oblique slices. NMR in biomedicine 2001; 14: 177-183.
5. Chen Z, Li S S, Yang J, Letizia D, Shen J, Measurement and automatic correction of high-order B0 inhomogeneity in the rat brain at 11.7 Tesla. Magn Reson Imaging. 2004; 22(6): 835-842.
6. Prammer M G, Haselgrove J C, Shinnar M, Leigh J S. A new approach to automatic shimming. J Magn Reson 1988; 77: 40-52.
7. Webb P, Macovski A. Rapid, fully automatic, arbitrary-volume in vivo shimming. Magn Reson Med 1991; 20: 113-122.
8. Kim D H, Adalsteinsson E, Glover G H, Spielman D M, Regularized higher order in vivo shimming, magnetic resonance in medicine 2002, 48: 715-722.
9. Schneider E, Glover G, Rapid in vivo shimming. Magnetic Resonance in Medicine: 1991, 18: 335-347.
10. Miyaska N, Takahashi K, Hetherington H P, Fully automated shim mapping method for spectroscopic imaging of the mouse brain at 9.4 T, Magn. Reson. Med. 2006, 55 198-202.
11. Hetherington H P Chu W J, Gonen O, Pan J W, Robust fully automated shimming of the human brain for high field spectroscopic imaging. Magn. Reson. Med. 2006, 56: 26-33.
12. Schar M, Kozerke S, Boesiger P, Bavigator gating and volume tracking for double triggered cardiac proton spectroscopy at 3 tesla. Magn. Reson. Med. 2004, 51: 1091-1095.
13. Hedley M, Rosenfeld D, A new two dimensional phase unwrapping algorithm for MRI images. Magnetic Resonance in Medicine. 1992, 24: 177-181.
14. Wilson J L, Jenkinson M, de Araujo I, Kringelbach M L, Rolls E T, Jezzard P, Fast fully automated global and local magnetic field optimization for FMRI of the human brain. Neuroimage 2002, 17: 967-976.
15. Bolan P J, Nelson M T, Yee D, Garwood M, Imaging in breast cancer: Magnetic resonance Spectroscopy. Breast Cancer Rsearch 2005, 7 149-152.
16. Dixon W T, Simple proton spectroscopic imaging. Radiology. 1984; 153(1):189-194.
17. Glover G H, Multipoint Dixon technique for water and fat proton and susceptibility imaging., J Magn Reson Imaging. 1991, 1(5): 521-530.
18. Glover G H, Schneider E., Three-point Dixon technique for true water/fat decomposition with $B_0$ inhomogeneity correction. Magn Reson Med. 1991; 18(2): 371-383.
19. Moriguchi H, Lewin J S, Duerk J L, Dixon techniques in spiral trajectories with off-resonance correction: a new approach for fat signal suppression without spatial-spectral pulses. Magn. Reson. Med. 2003, 50 915-924.
20. Boesch C, Slotboom J, Hoppeler H, Kreis R In vivo determination of intra-myocellular lipids in human muscle by means of localized 1H-MR-spectroscopy. Magn Reson Med. 1997; 37(4):484-493.
21. Hwang J H, Pan J W, Heydari S, Hetherington H P, Stein D T, Regional differences in intramyocellular lipids in humans observed by in vivo 1H MR spectroscopic imaging. J. Appl. Phsyiol. 2001; 90: 1267-1274.
22. Hetherington H P, Avdievich N I, Pan J W, Field map based shimming for organs outside of the human brain. Proceedings of the International Society for Magnetic Resonance in Medicine, May 2006, Seattle Wash. #63.

What is claimed is:
1. A method for mapping the inhomogeneity of a magnetic field within an object in an MRI system, said object containing a first and a second material comprising the steps of:
   a. acquiring a plurality of images with said MRI system at a corresponding plurality of evolution times,
   b. calculating the phase contribution to the plurality of images due to the second material, c. removing said contribution from each of said plurality of images to obtain a phase map reflective of the inhomogeneity of said magnetic field, d. unwrapping aliasing present in the phase maps of images having relatively longer evolution times by reference to phase maps of images having relatively shorter evolution times, and e. generating a single map of magnetic field inhomogeneity from the unwrapped results, wherein said plurality of images comprises a first image set of at least three images separated by a predetermined evolution time interval, $\Delta t$, and a second image set of $n \geq 3$ images each having evolution times respectively corresponding to ascending evolution delays $\Delta t_1$-$\Delta t_n$, said evolution delays measured relative to a reference image corresponding to evolution delay $\Delta t_0 = 0$, wherein the predetermined evolution time interval $\Delta t$ is a function of the chemical shift between said first and second material, and $\Delta t$ is defined by the equation $\Delta t = \frac{1}{2} \Delta v$ where $\Delta v$ is the chemical shift between said first and second material in Hertz, wherein the step of calculating the phase contribution to the plurality of images due to the second material comprises calculating a Dixon image from the images in said first image set, and wherein the step of unwrapping aliasing is performed on images in the second image set.

2. The method of claim 1, wherein said first image set and said second image set intersect.

3. The method of claim 1, wherein said first material is water and said second material has a Larmor frequency different from that of water.

4. The method of claim 3, wherein said second material is a lipid.

5. The method of claim 4, wherein said second material is human fat tissue.

6. The method of claim 1, wherein the step of unwrapping aliasing further comprises using the phase map of a base image to predict and correct for aliasing in a target image where said target image has a larger evolution delay than that of the base image.

7. The method of claim 6, wherein said predicting of aliasing in the target image comprises the steps of:

a. calculating a frequency map based on the respective evolution delays of the base image and the target image, and b. identifying regions in the target image, based on said frequency map, wherein:
  i. wrapping is not predicted to occur,
  ii. wrapping is predicted to occur, and
  iii. wrapping cannot be predicted.

8. The method of claim 7, wherein said correcting of said aliasing in the target image comprises the steps of:

c. measuring the phase difference between the base image and the target image as a function of their respective evolution delays and calculating the frequency based on the phase difference, in regions of the target image where wrapping is not predicted to occur, and d. correcting the phase and calculating the frequency based on the corrected phase in regions of the target image where wrapping is predicted to occur.

9. The method of claim 8, wherein the step of correcting of said aliasing further comprises retaining the current frequency value observed in the base image in regions of the target image where wrapping cannot be predicted to occur.

10. The method of claim 9, wherein the current frequency value is selectively retained when the calculated frequencies in the base and target image are significantly different.

11. The method of claim 10, wherein the evolution delay of the target image is longer than the evolution delay of the base image by a factor of two.

12. The method of claim 10, wherein the first image set and the second image set are selected to minimize differential T2 relaxation between the first material and the second material.

13. The method of claim 10, wherein the first image set and the second image set intersect.

14. The method of claim 10, wherein the second material comprises a plurality of compounds having different Larmor frequencies.

15. The method of claim 14, wherein said chemical shift is calculated based on an estimated Larmor frequency model corresponding to the composition of the second material.

16. The method of claim 10 further comprising using information from said map to compensate for inhomogeneity in the magnetic field within said MRI system.

17. The method of claim 16, wherein said information is uploaded to shimming coils to compensate for said inhomogeneity in said magnetic field.

* * * * *

UNITED STATES PATENT AND TRADEMARK OFFICE
CERTIFICATE OF CORRECTION

PATENT NO. : 7,609,060 B2  
APPLICATION NO. : 12/080510  
DATED : October 27, 2009  
INVENTOR(S) : Hoby P. Hetherington and Jullie W. Pan Page 1 of 1

It is certified that error appears in the above-identified patent and that said Letters Patent is hereby corrected as shown below:

In the specification,

Column 1, lines 12-19, should read:

-- STATEMENT OF GOVERNMENT SUPPORT

This invention was made with government support under grant numbers EB000473 and EB001748 awarded by the National Institutes of Health. The government has certain rights in the invention. --

Signed and Sealed this  
Third Day of November, 2015

Michelle K. Lee  
*Director of the United States Patent and Trademark Office*